United States Patent [19]
Fujii

[11] Patent Number: 5,157,467
[45] Date of Patent: Oct. 20, 1992

[54] QUANTUM INTERFERENCE DEVICE AND METHOD FOR PROCESSING ELECTRON WAVES UTILIZING REAL SPACE TRANSFER

[75] Inventor: Kazuhito Fujii, Atsugi, Japan

[73] Assignee: Canon Kabushiki Kaisha, Tokyo, Japan

[21] Appl. No.: 755,802

[22] Filed: Sep. 6, 1991

[30] Foreign Application Priority Data

Sep. 12, 1990 [JP] Japan .................. 2-241625

[51] Int. Cl.$^5$ ............... H01L 29/161; H01L 27/19
[52] U.S. Cl. .................. 357/16; 357/22; 357/30
[58] Field of Search ............ 357/22 A, 16, 30 E, 357/30 C

[56] References Cited

U.S. PATENT DOCUMENTS

| | | | |
|---|---|---|---|
| 4,882,608 | 11/1989 | Smith, III | 357/22 A |
| 4,912,451 | 3/1990 | Sugiyama et al. | 324/252 |
| 5,003,360 | 3/1991 | Okada et al. | 357/16 |

OTHER PUBLICATIONS

"Proposed Structure for Large Quantum Interference Effect" by S. Datta et al., Applied Physics Letter vol. 48, No. 7, 17 Feb. 1986 pp. 487–489.

"Valley Selective Tunneling Transistor Based on Valley Discontinuties in AlGaAs Heterostructures" Jasprit Singh, Applied Physics Letters vol. 55 No. 25, 18 Dec. 1989 pp. 2652–2654.

Primary Examiner—Eugene R. LaRoche
Assistant Examiner—Michael B. Shingleton
Attorney, Agent, or Firm—Fitzpatrick, Cella, Harper & Scinto

[57] ABSTRACT

A quantum interference device includes a source, a drain and waveguides with quantum structures between the source and the drain. An electron wave from the source that is confined in the waveguides is split into plural electron waves. The phase difference between the split electron waves is controlled and the split electron waves are combined into a single electron wave. The combined electron wave is directed to the drain or out of the waveguides according to an energy state of the combined electron wave by a real space transfer such as a tunneling effect. The phase difference control may be achieved by varying an electric field, a magnetic field, or light.

22 Claims, 7 Drawing Sheets

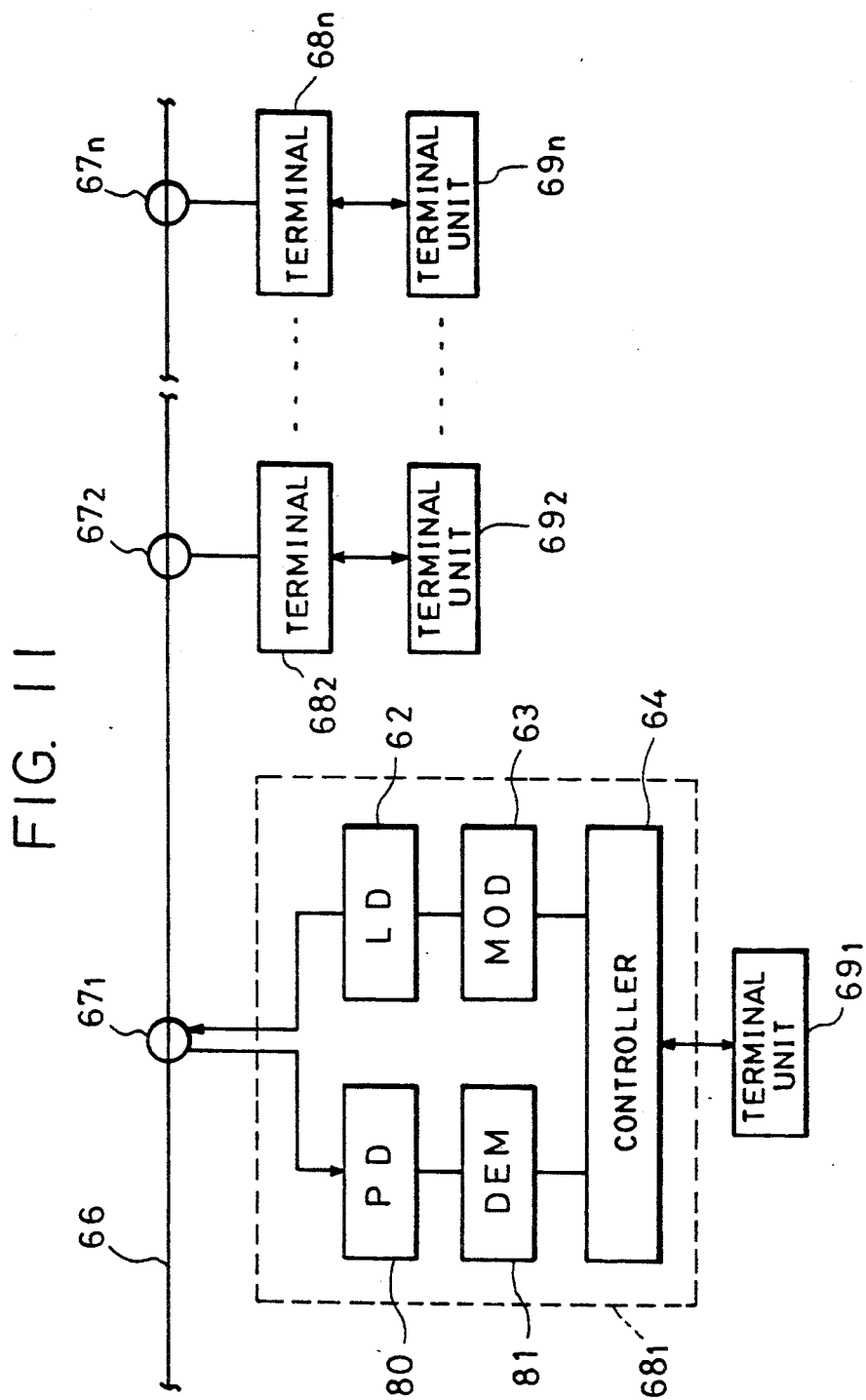

5,157,467

QUANTUM INTERFERENCE DEVICE AND METHOD FOR PROCESSING ELECTRON WAVES UTILIZING REAL SPACE TRANSFER

BACKGROUND OF THE INVENTION

1. Field of the Invention

This invention relates to quantum interference devices for converting signals carried by magnetic fields, electric fields, light (intensity, wavelength) or the like into electric signals by use of the Aharonov-Bohm effect (AB effect), optical Stark effect and so forth, and methods for processing electron waves utilizing a real space transfer.

2. Related Background Art

Conventionally, there has been developed a quantum interference device as shown in FIG. 1. This device operates in the following fashion.

An electron wave injected by an electrode 10 is propagated through a part (left end part in FIG. 1) in which the distance between two electron waveguides 11 and 12 is made short enough to couple the electron wave, and arrives at a decoupling part 15 or wave branching part. In this decoupling part 15 which is indicated by dotted loop lines on the left side in FIG. 1, the distance between two electron waveguides 11 and 12 is made longer than that in the coupling part at the left end part, so that the electron wave divides into two waves in this decoupling part. In the coupling part 16 Si is doped so that the Fermi level in the two electron wave waveguides 11 and 12 may be located between first and second quantum levels or subbands. Thus, the electron wave is concentrated solely into the first level below the Fermi level, leading to the coupling of the electron waves. Practically, the coupling and decoupling are achieved by varying the thickness of an AlAs layer which is a barrier layer 13. That is, the barrier 13 is thinner at the two ends so that there is considerable tunneling between the waveguides or wells 11 and 12 at the ends but hardly any tunneling in the central region.

In the decoupling part 15, the phase difference between the two electron waves is due to the AB effect (more in detail, magnetostatic AB effect) by applying thereto the magnetic field in a direction normal to the sheet of FIG. 1. The two electron waves are coupled at the coupling part 16 on the right side in FIG. 1 indicated by dotted loop lines, and thus there is generated a bonding state having a lower energy or an antibonding state having a higher energy. Here, the Fermi level is adjusted by doping, so that only the electron wave having lower energy reaches a drain 14. That is, an effect similar to the optical interference effect occurs between the two coupling electron waves, and there are cases where electrons can reach the electrode 14 at the detection side and where electrons do not reach the electrode. As a result, on/off control of the device is performed.

The length of the decoupling part should be less than 1 μm at liquid helium (LHe) temperatures under present day technologies, because coherency of the electron waves needs to be maintained.

This device is disclosed in S. Datta, et., Appl. Phys. Lett. 48(7), Feb. 17, 1986, pp. 487-489.

Further, there has also been proposed a device such as shown in FIG. 2, which utilizes real space transfer without using the tunneling phenomenon. The device of FIG. 2 does not utilize the electron wave, but such a device can readily be modified to take the electron wave out of the quantum structure by replacing a layer 20 through which current flows with a quantum well or the like.

The idea for this device is based on the energy discontinuity at the heterjunction region (junction between layers 20 and 21) which differs between $\Gamma$ and X valleys in a wave number space or k space. For example, if the Al mole fractions x,y of the layers 20 and 21 are assumed to be 0.33 and 0.6, respectively, the energy discontinuities at the junction between the n-AlGaAs layer 20 and i-AlGaAs layer 21 are +0.23 eV at the $\Gamma$ valley and +0.03~0.075 eV at the X valley. Here, where the energy of the i-AlGaAs layer 21 is higher than that of the n-AlGaAs layer 20 as a reference, the sign is +, and where lower, the sign is −. So, while electrons at the $\Gamma$ valley cannot easily come out of the n-AlGaAs layer 20 owing to the energy barrier by the layer 21, electrons at the X valley can readily travel out of the n-AlGaAs layer 20. As a result, it can be seen that desired operations such as on/off control of the current will be achieved by transferring the electrons in the n-AlGaAs layer 20 from the $\Gamma$ valley to X valley.

In order to obtain this operation, a voltage ($V_s$) is applied along the layer surface of the device (lateral direction in FIG. 2) so that the wave number k of the electron may be increased to cause the above electron transfer. At the same time, a voltage ($V_T$) is applied also in the direction of layer thickness so as to cause the current to flow out in this direction (perpendicular direction in FIG. 2). When the voltage Vs is switched between $V_s=1$ V (assuming that the distance between electrodes is 1 μm and $V_s=0$ V at a temperature of 77 K, the ratio of current flowing in the perpendicular direction of layer thickness due to the transfer to the X valley is $10^5$ ($V_s=1$ V):1 ($V_s=0$ V). Thus, electrons can efficiently transfer from the $\Gamma$ valley to X valley by the application of a voltage in the lateral direction of layer surface. The above structure is disclosed in the Jasprit Singh, Appl. Phys. Lett. 55(25), Dec. 18, 1989 pp. 2652-2654.

However, those prior art devices have the following disadvantages. In the device of FIG. 1, there are problems in that the electron wave in the antibonding state reflected by the coupling part at the side of the drain 14 generates heat in a region between the source 10 and drain 14 and in that the reflected electron wave passes the source 10 as noise to other devices. Further, since only such is measured in which the phase difference between two electron waves is 2 m$\pi$ (m:integer), the S/N of a signal will be poor.

On the other hand, in the device of FIG. 2 in which the voltage is applied in the lateral direction of layer surface as a means for attaining the real space transfer, there is a problem that such a device is unsuitable where it is required that the expansion or dispersion of wave numbers of travelling electrons be as small as possible to achieve sharper interference, such as quantum interference devices. Further, the problem of S/N also exists in this device.

SUMMARY OF THE INVENTION

An object of the present invention is to provide a quantum interference device which overcomes the problem of reflected electron waves as well as the problem of dispersion of wave numbers in conducted electrons.

Another object of the present invention is to provide a method for processing electron waves utilizing real space transfer which overcomes the problem of a reflected electron wave as well as the problem of dispersion of wave numbers in conducted electrons.

The invention is directed to a quantum interference arrangement in which electron waves are propagated through quantum structure paths and then combined into a single electron wave. The combined electron wave is taken out of the paths by a real space transfer according to its energy state.

According to one aspect of the quantum interference device of the present invention, the device comprises:
  a source;
  a drain;
  a plurality of waveguides having quantum structures, respectively, said waveguides extending from said source to said drain;
  means for splitting an electron wave confined in said waveguides from said source into a plurality of electron waves;
  means for combining the split electron waves into a single electron wave;
  means for controlling a phase difference between the split electron waves; and
  means for directing the combined electron wave either to said drain or out of said waveguides, depending on an energy state of the combined electron wave by use of a real space transfer.

According to another aspect of the quantum interference device of the present invention, the device comprises:
  a plurality of paths having quantum structures, respectively;
  means for combining electron waves propagated through said paths into a single electron wave; and
  means for taking the combined electron wave out of said paths, depending on an energy state of the combined electron wave by use of a real space transfer.

According to one aspect of the method for processing electron waves of the present invention, the method comprises the steps of:
  applying a first voltage to waveguides for propagating electron waves to produce a single electron wave;
  splitting the single electron wave into two electron waves;
  controlling a phase difference between the split electron waves;
  applying a second voltage to the waveguides to combine the split electron waves into a single electron wave; and
  directing the combined electron wave out of the waveguides, depending on an energy state of the combined electron wave by use of a real space transfer.

According to another aspect of the method for processing electron waves of the present invention, the method comprises the steps of:
  applying a voltage to paths for propagating electron waves to combine the electron waves propagated through the paths into a single electron wave; and
  taking the combined electron wave out of the paths, depending on an energy state of the combined electron wave by use of a real space transfer.

These advantages and others will be more readily understood in connection with the following detailed description, claims and drawing.

BRIEF DESCRIPTION OF THE DRAWINGS

FIG. 11 is a block diagram showing an example of optical communication systems in which the quantum interference device of this invention is used as a photodetector.

DESCRIPTION OF THE PREFERRED EMBODIMENT

Figure 3:
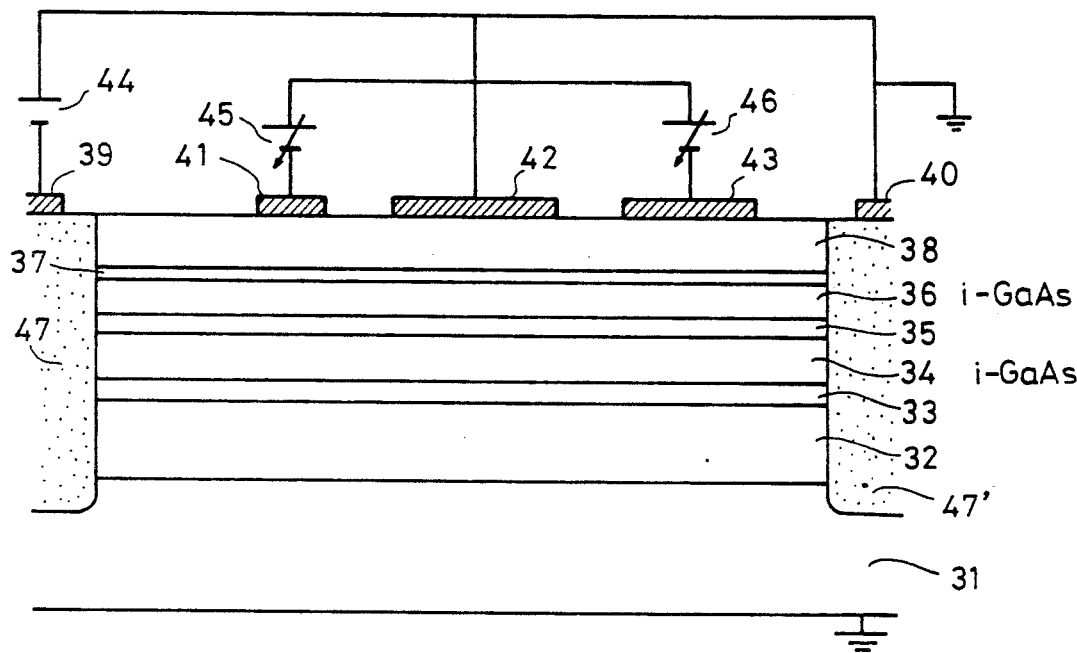
FIG. 3 is a sectional view of a first embodiment of the present invention.

FIG. 3 shows the structure of a first embodiment of the present invention. In FIG. 3, there is provided an n-GaAs substrate 31, and on this substrate 31, an n-$Al_xGa_{1-x}As$ layer 32, an i (intrinsic)—AlAs layer 33, an i-GaAs layer 34, an i-AlAs layer 35, an i-GaAs 36, an i-AlAs layer 37, an n-$Al_{0.3}Ga_{0.7}As$ layer 38, and an n-GaAs cap layer (not shown) are formed in this order by the conventional molecular beam epitaxy (MBE) process. This cap layer provides ohmic contacts at a source electrode 39 and a drain electrode 40, and the cap layer is removed at portions other than the portions under these electrodes 39 and 40.

The straight electron waveguides are respectively constituted by the i-GaAs layers 34 and 36 interposed between the i-AlAs layers 33, 35 and 37. The thicknesses of the i-GaAs layer 34 near the substrate 31, i-GaAs layer 36 and i-AlAs layer 35 sandwiched by these layers 34 and 36 are respectively set, e.g., to 45 Å, 40 Å and 22 Å. Namely, the thickness of the lower GaAs layer 34 is made larger than that of the upper GaAs layer 36 such that the electron wave may be split into two in an equal ratio at the decoupling part under an electrode 42. Thus, an asymmetric double quantum well structure is fabricated. As regards the thickness of the lowest i-AlAs layer 33, this is set to about 30 Å for improving an energy selectivity of tunneling electrons mentioned below.

Figure 4:
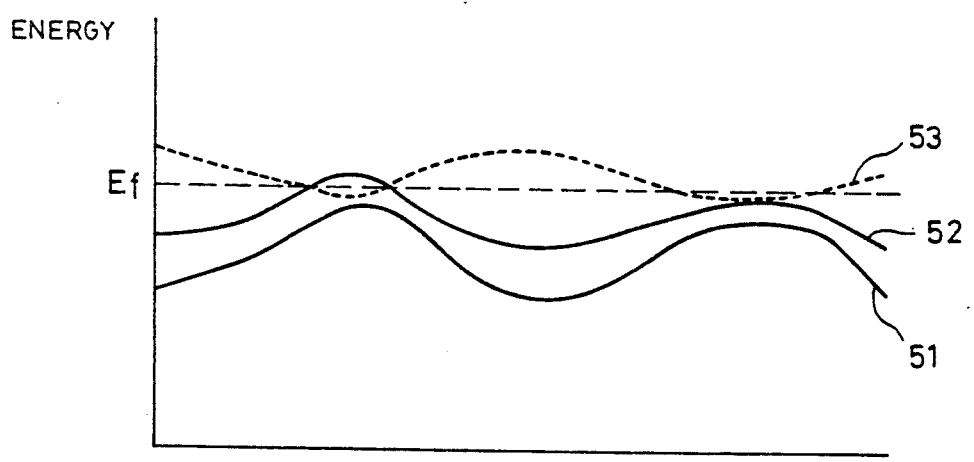
FIG. 4 is a view illustrating the change of energy levels of subbands in waveguides along the electron wave propagating direction in the first embodiment of FIG. 3.

In addition, the distance between gate electrodes 41 and 42 is approximately 0.6 μm and the electric field thereat is adjusted to 100 kV/cm so as to construct the decoupling or branching part in which the 1:1 ratio of branching probabilities is obtained. The dopant concentration in the n-AlGaAs layer 38 is adjusted such that the difference between the Fermi level $E_f$ and the lowest energy level 51 of the wells 34 and 36 under the gate 42 becomes 15 meV as shown in FIG. 4. This value of dopant concentration is of an order of $10^{17}-10^{18}$ cm$^{-3}$.

Under these conditions, the electron wave is split in a 1:1 ratio and two coherent electron waves are propagated through the electron waveguides of wells 34 and 36.

In the coupling or combining part under the gate electrode 43, the distance between the gates 42 and 43 is set to about 0.6 μm and the electric field in this region is set to about 115 kV/cm. The width (length in the lateral direction in FIG. 3) of the gate electrode 43 is 2 μm-3 μm to realize sufficient tunneling of the electron wave in a higher energy state (indicated by a curve 52 in FIG. 4) to the side of the substrate 31 as the electron wave passes the region under gate electrode 43. In the region under the gate 43, an n-Al$_y$Ga$_{1-y}$As layer (not shown) more highly doped than the layer 38 and having the thickness of about 300 Å is formed between the layer 38 and gate electrode 43 so as to locate the Fermi energy E$_f$ above the two states of electron wave (illustrated by the curves 51 and 52) under the gate electrode 43. Here, the relation y<0.3 must be satisfied.

FIG. 4 illustrates the fashion in which the energy levels 51 and 52 of thus constructed well layers 34 and 36 vary along the propagation direction of electron wave, relative to the Fermi level as a reference. A broken line 53 in FIG. 4 shows the change of an energy level in the conduction band at the junction between the layers 32 and 33 along the electron wave propagation direction.

As shown in FIG. 3, there are further provided an electric source 44, variable sources 45 and 46 and AuGe diffusion regions 47 and 47'.

Figure 5:
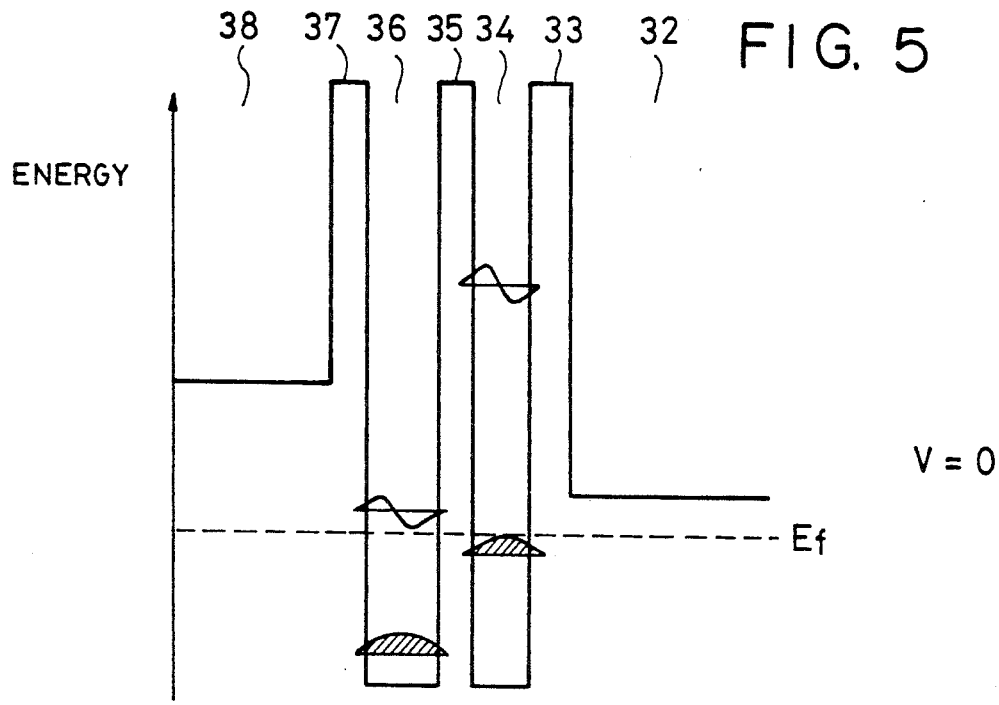
FIG. 5 is a view showing a band structure and wave functions at a part of the device right downstream the source in FIG. 3.

Referring now to FIG. 5, there is shown a band structure in the conduction band of the above structure at the time of a zero bias (this state is realized at a part just downstream the source 39), and a broken line designates the Fermi level E$_f$ and first and second quantum levels are illustrated in the energy levels of the wells 34 and 36. Wave functions are also depicted and hatched ones represent electron-occupied levels.

Figure 6:
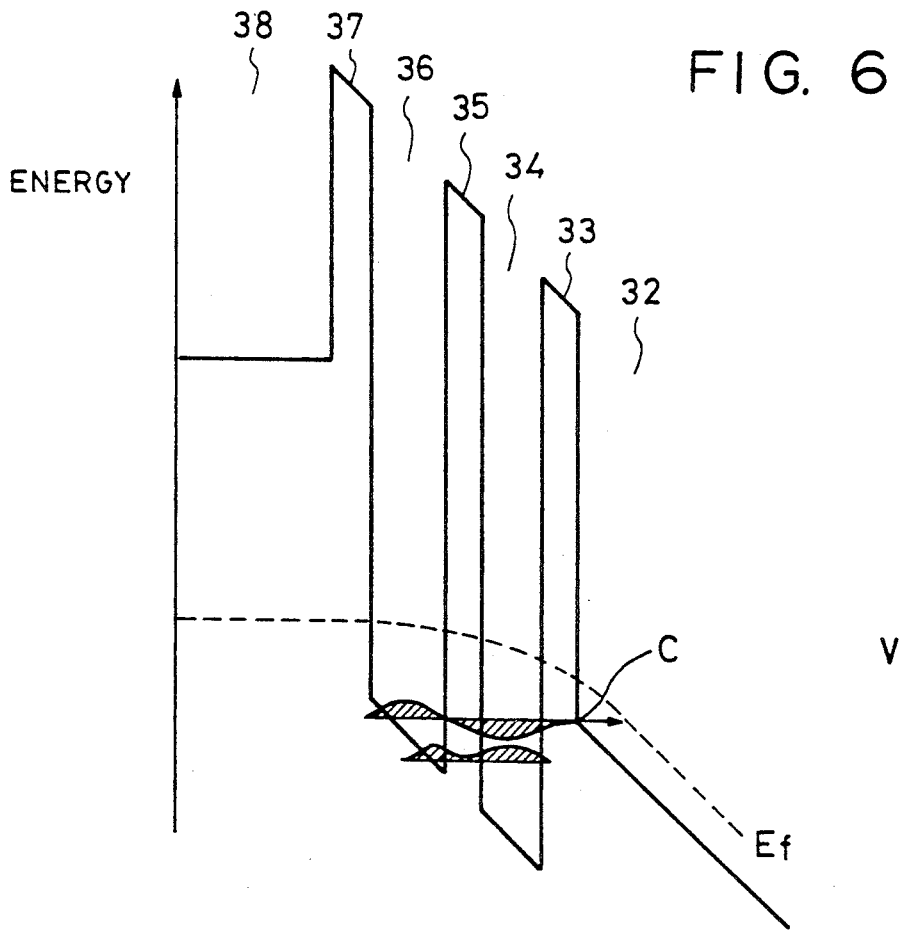
FIG. 6 is a view showing a band structure and wave functions of coupled electron waves at a part under the gate electrode 43 in FIG. 3.

FIG. 6 shows a similar band structure directly under the gate 43, but the second level of each well 34 and 36 is omitted. The energy difference between the bonding state (indicated by a hatched wave function at a lower level) and antibonding state (indicated by another hatched wave function at a higher level) is about 20 meV. Here, the electron wave in the antibonding state moves out to the n-Al$_x$Ga$_{1-x}$As layer 32 due to the tunneling effect (see an arrow in FIG. 6). This is because the thickness of the i-AlAs layer 33 is set in the manner described above and because the level of the above antibonding state during the bias time is equal to or higher than the level at a junction c between the barrier layer 33 and n-Al$_x$Ga$_{1-x}$As layer 32. In the example of FIG. 6, those levels are equal. But, the former level may be a little lower than the latter level so long as sufficient tunneling is attained.

Therefore, the electron wave will occupy the antibonding state which has been produced by the coupling of two electron waves having therebetween the phase difference of (2 m+1)π. This electron wave in the antibonding state moves out toward the substrate 31 and thus will not reach the drain electrode 40. The above two electron waves occupy the two levels below the Fermi level E$_f$ in the branching part between gate electrodes 41 and 43.

In contrast, such electron wave produced by two split electron waves whose phase difference is 2 mπ will occupy the bonding state (indicated by the hatched wave function at the lower level in FIG. 6) and reach the drain electrode 40 since the movement toward the substrate 31 is prevented.

In this first embodiment, the control of the phase difference between the two electron waves is performed by varying either or both the voltages of sources 45 and 46 (i.e., voltages between the electrodes 41 and 42 and between the electrodes 42 and 43) merely about 1%. So, deviations of the distance between the electrodes 41 and 42 and so forth from design values can be compensated for by adjusting voltage sources 45 and 46 slightly. The voltage source 45 also acts to make the higher energy level 52 higher than the Fermi level E$_f$ while making the lower energy level 51 lower than E$_f$ in order to generate a single coupled electron wave upstream the decoupling part between the electrodes 41 and 43.

Thus, a quantum interference device usuable as field-effect transistor and the like is accomplished in which the current to the drain 40 is modulated by controlling at least one of the voltages between the electrodes 41 and 42 and between the electrodes 42 and 43 slightly.

Figure 7:
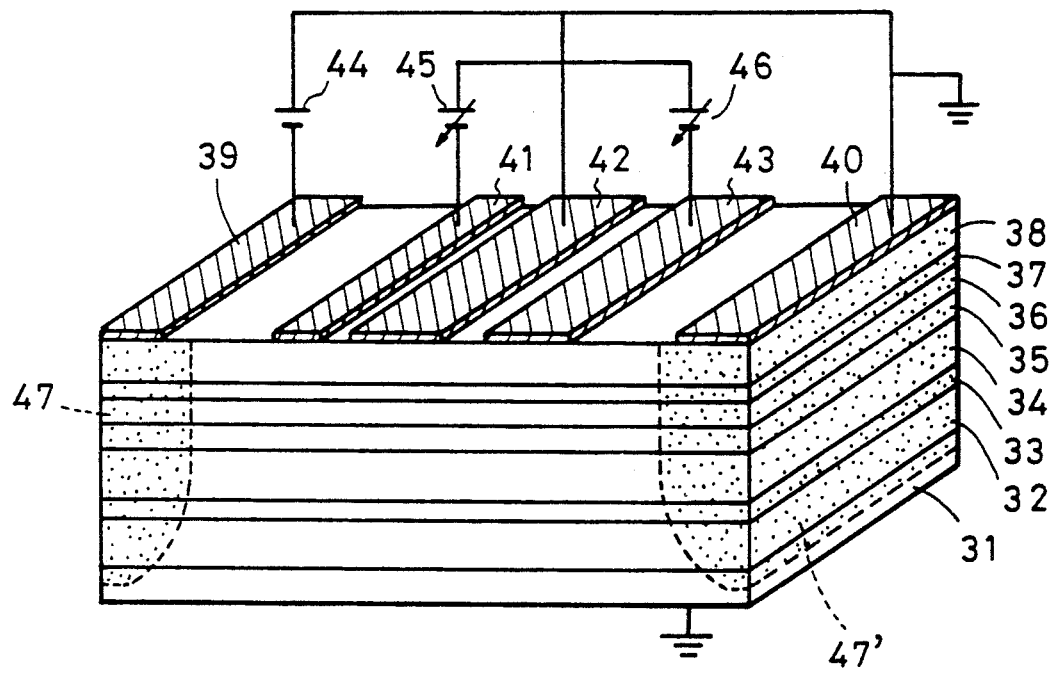
FIG. 7 is a perspective view of a whole structure of the first embodiment shown in FIG. 3.

FIG. 7 illustrates a whole structure of this embodiment.

Other methods are applicable to modulate the phase difference in the decoupling part.

Figure 8:
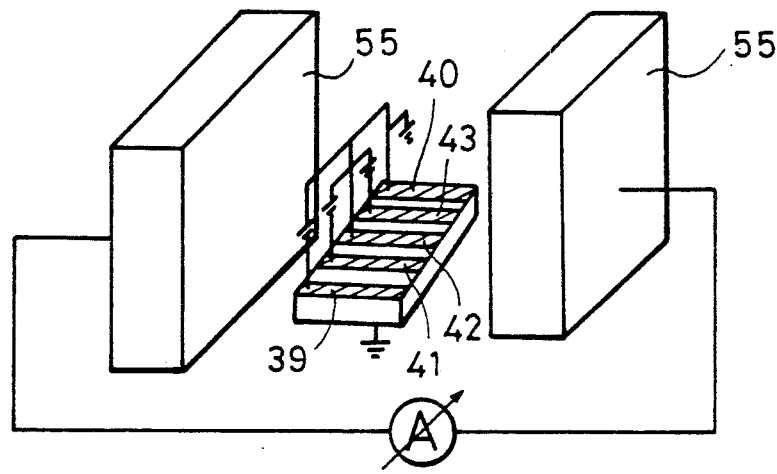
FIG. 8 is a perspective view of a second embodiment of the present invention.

One is as follows. As shown in FIG. 8, in the second embodiment, the voltages between the gate electrodes 41, 42 and 43 are maintained unchanged, and a magnetic field applied to a part between the two electron waves in the decoupling part will be modulated. The phase difference θ between the two electron waves is represented by $$\theta = 2\pi e/ch \cdot \Phi$$

where Φ is a magnetic flux passing the part between the two electron waves, e is the charge of an electron, c is the velocity of light and h is Planck constant. In this second embodiment, the current to the drain 40 is on-off controlled depending on whether the phase difference is an even number multiple of π or odd number multiple thereof. In this case, the signal current of the device is turned on when current flowing in an electromagnet 55 is switched on. The relationship between the direction of the magnetic field and the structure of the layers is the same as in the prior art device of FIG. 1.

Figure 9:
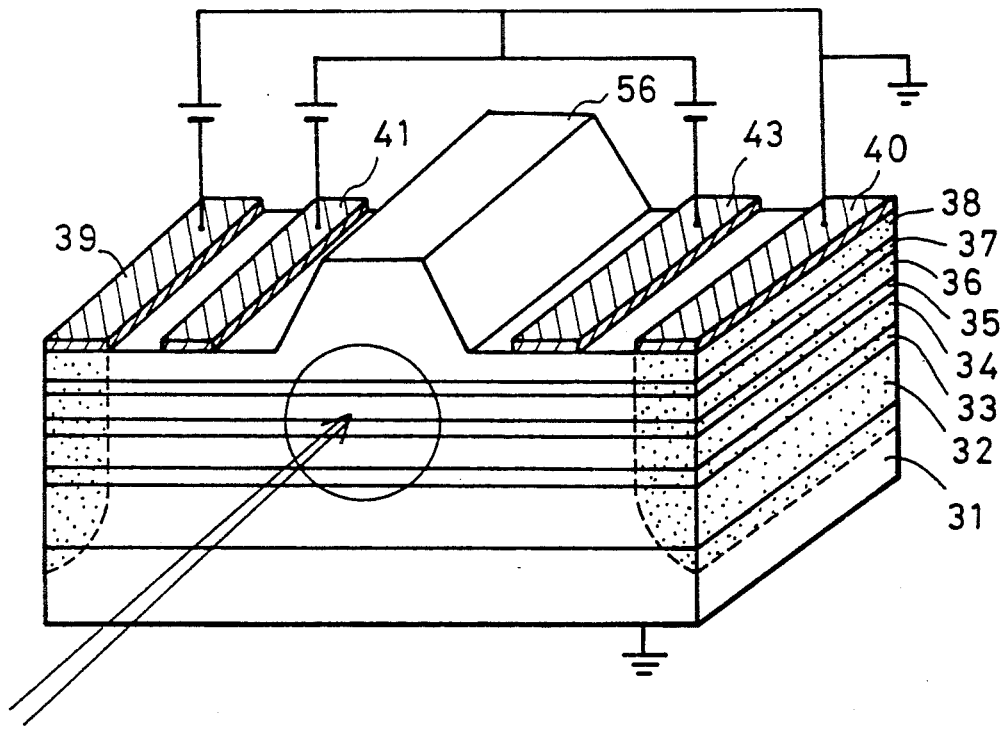
FIG. 9 is a perspective view of a third embodiment of the present invention.

Next, another method is to direct light to the decoupling part of the device. In this third embodiment, as shown in FIG. 9, a ridge type of light waveguide 56 is formed for this purpose. The subband levels in the wells are varied by the propagated light due to the optical Stark effect, leading to the modulation of the phase difference and hence the current to the drain. The propagated light is preferably polarized in a direction perpendicular to the plane of the stacked layers.

While in the above embodiments the electron wave in the antibonding state is picked out of the electron wave waveguides, it is possible to pick the electron wave in the bonding state out of the waveguides in order to obtain the same function as an ordinary quantum interference device. In this case, the energy level of the valence band at the junction between the barrier layer 33 and n-Al$_x$Ga$_{1-x}$As layer 32 shown in FIG. 6 is made equal to or higher than the level of the electron wave in the bonding state. Or, this energy level may be made a littler lower than the latter level as long as sufficient tunneling is attained.

As has been explained above, according the present invention, the electron wave in a certain given energy level is picked out of the electron wave waveguides at the drain by use of the real space transfer, such as the picking-out of the electron wave toward the electrode at the substrate side due to the tunneling. So, the reflected electron wave would not appear and so there are no adverse influences on other circuits, etc.

Further, even if the electric field applied in the lateral direction along the layer plane is small, the electron wave in the prescribed energy level (bonding state or antibonding state) can be transferred out of the electron wave waveguides. Such a requirement can be met so that the dispersion of wave numbers of conducted electrons should be as small as possible.

Still further, the condition of electron wave reaching the drain can clearly be discriminated by measuring the electron wave picked out at the electrode on the substrate side. That is, for instance, discrimination can be made between the state in which the electron wave does not reach the drain because no electrons are supplied from the source and the state in which the electron wave does not reach the drain because the electron wave is picked out at the electrode on the substrate side. Hence, the S/N can also be improved.

While GaAs/AlGaAs is used in the above embodiments, other materials such as other III-V group materials, II-VI group materials such as CdTe may be employed to construct the device.

Figure 10:
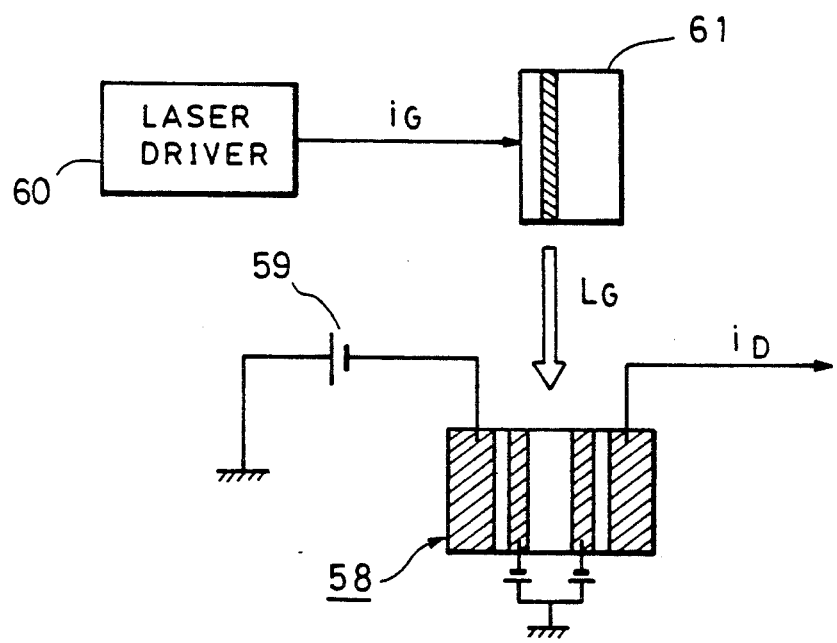
FIG. 10 is a block diagram showing an example in which the quantum interference device of this invention is used as an optical gate transistor.

Turning to FIG. 10, there is shown a block diagram illustrating an example in which the embodiment of FIG. 9 is used as an optical gate transistor. In FIG. 10, a voltage is applied by a source 59 between electrodes of a device 58 as shown in FIG. 9. A gate light $L_G$ is also applied to this device from a laser light source 61 such as a semiconductor laser. This laser light is modulated by a current $i_G$ supplied to the laser light source 61 from a laser driver 60, and thus a drain current $i_D$ is modulated in the device 58. If the gate light $L_G$ is a pulsed light whose pulse width is below 1 ps, the drain current $i_D$ can be modulated at this speed, and high-speed current modulation can be attained.

FIG. 11 shows an example in which the device mentioned above is used as a photodetector in an optical communication system. In FIG. 11, a plurality of terminals $68_1, 68_2, \ldots, 68_n$ are connected to an optical fiber 66 to transmit light signals, through optical nodes 67, $67_2, \ldots, 67_n$. Connected to respective terminals are terminal units $69_1, 69_2, \ldots, 69_n$ which respectively include a keyboard, a display device and so forth. Each terminal has a light signal transmitter including a modulator circuit 63, a laser light source 62 and a light signal receiver comprising of a photodetector 80 and a demodulator circuit 81. The transmitter and receiver are controlled by a controller 64 in accordance with an instruction from the terminal unit $69_1$. The device as shown in FIG. 9 can preferably be used as the photodetector 80.

While there has been shown and described what are considered preferred embodiments of the present invention, it will be obvious to those skilled in the art that various changes and modifications may be made therein without departing from the invention as defined by the claims.

What is claimed is:
1. A quantum interference device comprising:
   a source;
   a drain;
   a plurality of waveguides having quantum structures, respectively, said waveguides extending between said source and said drain;
   means for splitting an electron wave from said source confined in said waveguides into a plurality of electron waves;
   means for combining the split electron waves into a single electron wave;
   means for controlling a phase difference between the split electron waves; and
   means for directing the combined electron wave to said drain or out of said waveguides, depending on an energy state of the combined electron wave by a real space transfer.

2. A quantum interferometer device according to claim 1, wherein the real space transfer is performed by causing the combined electron wave in a predetermined energy state to tunnel through a barrier layer formed adjacent to one of said waveguides.

3. A quantum interferometer device according to claim 2, wherein said tunneling is conducted by setting an energy level of a conduction band at a junction between said barrier layer and a layer at the side of a substrate adjacent to said barrier layer to a level equal to or lower than a level of said predetermined energy state.

4. A quantum interferometer device according to claim 2, wherein said tunneling is conducted by setting an energy level of a valence band at a junction between said barrier layer and a layer at the side of a substrate adjacent to said barrier layer to a level equal to or higher than a level of said predetermined energy state.

5. A quantum interferometer device according to claim 1, wherein first and second subbands of said waveguides at said combining means are set to levels lower than a Fermi level.

6. A quantum interferometer device according to claim 1, wherein said splitting means splits the electron wave by setting first and second subbands of said waveguides to levels lower than a Fermi level.

7. A quantum interferometer device according to claim 1, wherein said controlling means controls the phase difference by modulating a voltage applied to said waveguides.

8. A quantum interferometer device according to claim 1, wherein said controlling means controls the phase difference by modulating a light directed to said waveguides.

9. A quantum interferometer device according to claim 1, wherein said controlling means controls the phase difference by modulating a magnetic field applied to said waveguides.

10. A quantum interferometer device according to claim 1, wherein said waveguides extending between said source and said drain are substantially straight.

11. A quantum interferometer device according to claim 1, wherein said device is as a photodetector.

12. A quantum interferometer device according to claim 1, wherein said device is an optical gate transistor.

13. A quantum interference device comprising:
   a plurality of paths having quantum structures, respectively;
   means for combining electron waves propagated through said paths into a single electron wave; and means for taking the combined electron wave out of said paths, depending on an energy state of the combined electron wave by a real space transfer.

14. A method for processing electron waves comprising the steps of:
applying a first voltage to waveguides for propagating electron waves to produce a single electron wave;
splitting the single electron wave into two electron waves;
controlling a phase difference between the split electron waves;
applying a second voltage to the waveguides to combine the split electron waves into a single electron wave; and
directing the combined electron wave out of the waveguides, depending on an energy state of the combined electron wave by a real space transfer.

15. A method for processing electron waves according to claim 14, wherein the real space transfer is performed by causing the combined electron wave in a predetermined energy state to tunnel through a barrier layer formed adjacent to one of the waveguides.

16. A method for processing electron waves according to claim 15, wherein said tunneling is conducted by setting an energy level of a conduction band at a junction between the barrier layer and a layer at a side of a substrate adjacent to the barrier layer to a level equal to or lower than a level of the predetermined energy state.

17. A method for processing electron waves according to claim 15, wherein said tunneling is conducted by setting an energy level of a valence band at a junction between the barrier layer and a layer at a side of a substrate adjacent to the barrier layer to a level equal to or higher than a level of the predetermined energy state.

18. A method for processing electron waves according to claim 14, wherein said splitting is conducted by setting first and second subbands of the waveguides to levels lower than a Fermi level.

19. A method for processing electron waves according to claim 14, wherein said controlling is conducted by modulating the voltages applied to the waveguides.

20. A method for processing electron waves according to claim 14, wherein said controlling is conducted by modulating a light directed to the waveguides.

21. A method for processing electron waves according to claim 14, wherein said controlling is conducted by modulating a magnetic field applied to the waveguides.

22. A method for processing electron waves comprising the steps of:
applying a voltage to paths for propagating electron waves to combine the electron waves propagated through the paths into a single electron wave; and
taking the combined electron wave out of the paths, depending on an energy state of the combined electron wave by a real space transfer.

* * * * *

UNITED STATES PATENT AND TRADEMARK OFFICE
CERTIFICATE OF CORRECTION

PATENT NO. : 5,157,467

DATED : October 20, 1992

INVENTOR(S) : KAZUHITO FUJII

It is certified that error appears in the above-identified patent and that said Letters Patent is hereby corrected as shown below:

On drawing sheet,

<u>SHEET 1 OF 7</u>

Figure 1:
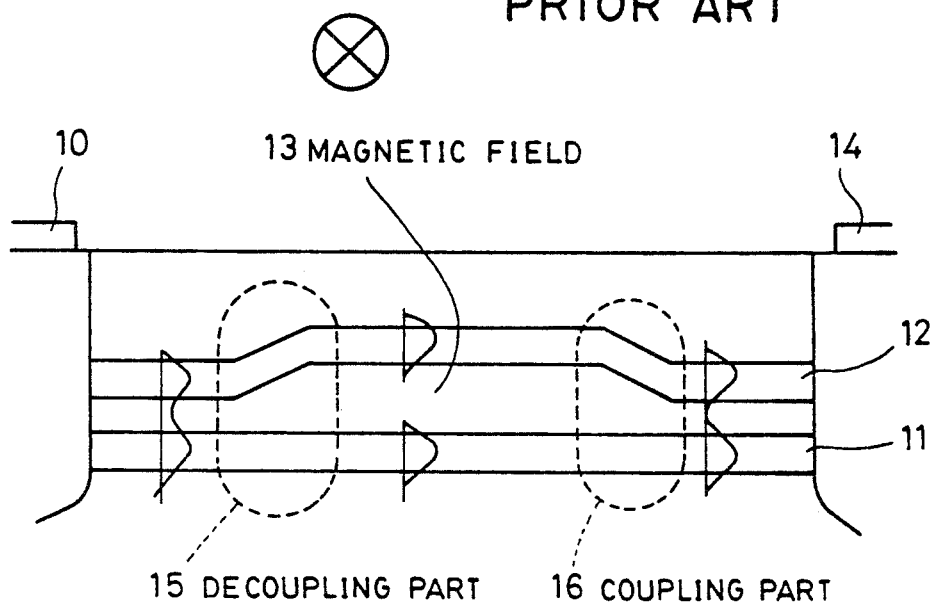
FIG. 1 is a sectional view of a first prior art quantum interference device.
Figure 2:
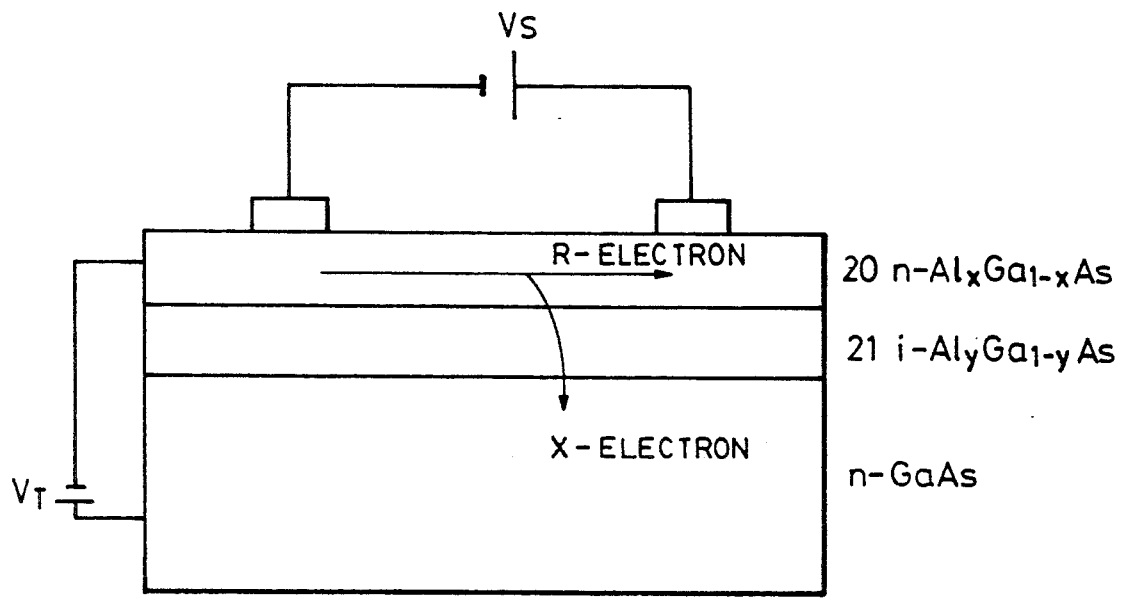
FIG. 2 is a view of a second prior art device utilizing carrier transfer in a k space.

FIG. 1, "   should read --  MAGNETIC FIELD

13 MAGNETIC FIELD  13

 "  --.

<u>COLUMN 1</u>

Line 29, "part 16" should read --part 16,--.

<u>COLUMN 2</u>

Line 5, "heterjunction" should read --heterojunction--.
Line 33, "1 µm" should read --1µm)--.

<u>COLUMN 3</u>

Line 68, "drawing." should read --drawings.--.

<u>COLUMN 4</u>

Line 39, "i-GaAs 36," should read --i-GaAs layer 36,--.
Line 66, "probalities" should read --probabilities--.

<u>COLUMN 6</u>

Line 21, "usuable" should read --usable--.

UNITED STATES PATENT AND TRADEMARK OFFICE
CERTIFICATE OF CORRECTION

PATENT NO. : 5,157,467
DATED : October 20, 1992
INVENTOR(S) : KAZUHITO FUJII

It is certified that error appears in the above-identified patent and that said Letters Patent is hereby corrected as shown below:

COLUMN 7

Line 56, "of" should be deleted.
Line 68, "interference" should read --interferometer--.

COLUMN 8

Line 60, "as" should be deleted.

Signed and Sealed this

Twenty-fifth Day of April, 1995

Attest:

BRUCE LEHMAN

Attesting Officer

Commissioner of Patents and Trademarks